United States Patent [19]

Okada

[11] Patent Number: 5,023,842

[45] Date of Patent: Jun. 11, 1991

[54] SEMICONDUCTOR MEMORY HAVING IMPROVED SENSE AMPLIFIERS

[75] Inventor: Yoshio Okada, Tokyo, Japan

[73] Assignee: Kabushiki Kaisha Toshiba, Kawasaki, Japan

[21] Appl. No.: 375,902

[22] Filed: Jul. 6, 1989

[30] Foreign Application Priority Data

Jul. 11, 1988 [JP] Japan ................................. 63-172315

[51] Int. Cl.[5] .............................................. G11C 11/34
[52] U.S. Cl. .................................. 365/205; 365/189.09
[58] Field of Search ................ 365/203, 205, 207, 208, 365/210, 189.09; 307/530

[56] References Cited

U.S. PATENT DOCUMENTS 4,551,641 11/1985 Pelley, III ..................... 365/205 X
4,780,850 10/1988 Miyamoto et al. ............. 365/205 X Primary Examiner—Joseph A. Popek
Attorney, Agent, or Firm—Finnegan, Henderson, Farabow, Garrett, and Dunner

[57] ABSTRACT

A semiconductor memory device comprises a sense amplifier, a reference potential terminal, a switching element, and control. The switching element is connected between sense amplifier and said reference potential terminal. The control generates and supplies a first column-selecting signal to the switching element to turn on and off switching element.

20 Claims, 4 Drawing Sheets

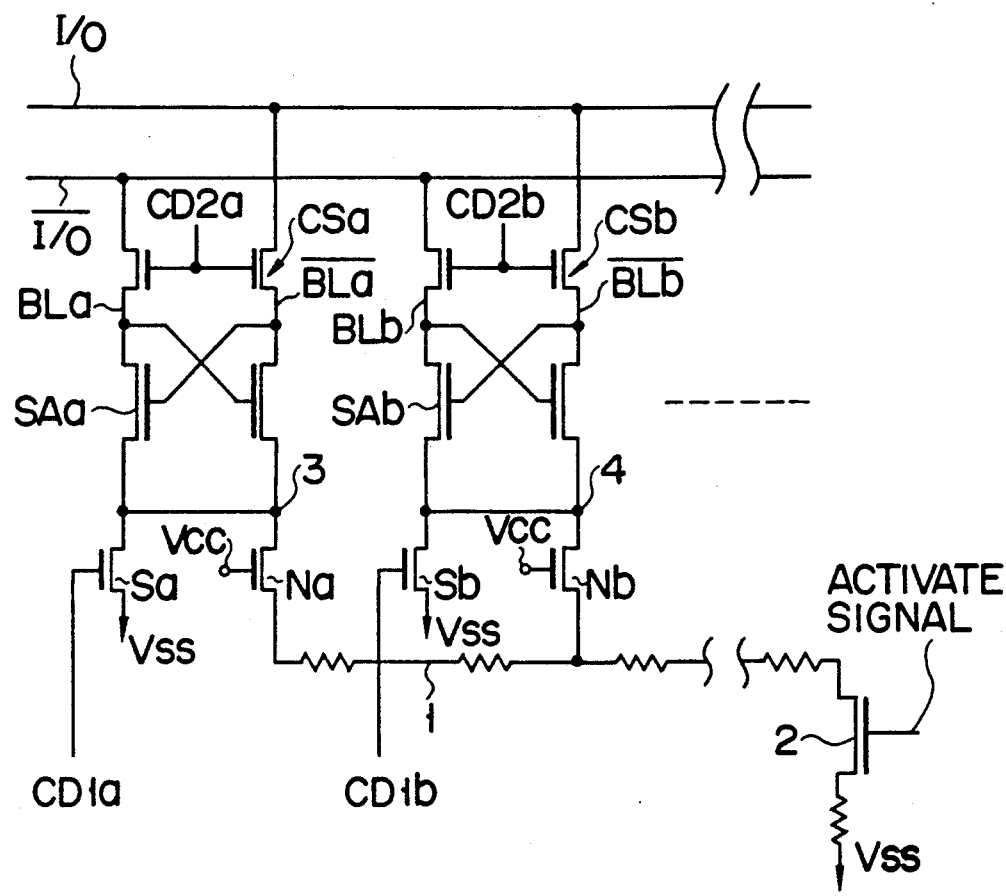
F I G. 1

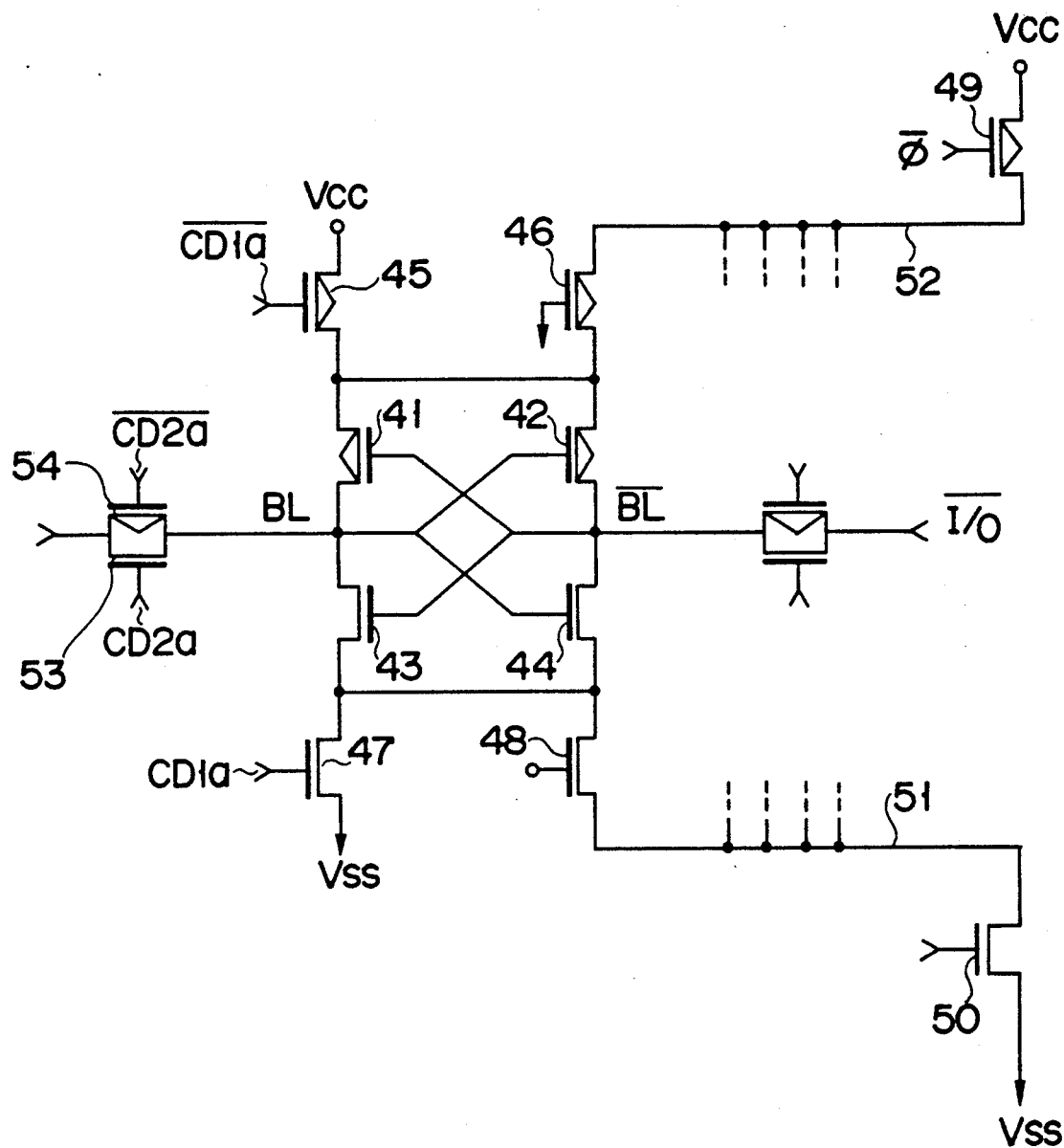
F I G. 4 ered at the Vss terminal. Various parasitic resistances exist between the sense amplifiers and the Vss terminal, such as the resistance of the source line 31, the resistance of the MOS transistor 32, and the resistance of the Vss power-supply line. The greater the storage capacity of the DRAM, and hence, the larger the chip of the DRAM, the higher these parasitic resistances. Further, the greater the storage capacity of the DRAM, the greater the number of the bit-line sense amplifiers, which are simultaneously activated. More specifically, when the storage capacity increases four times, twice as many bit-line sense amplifiers are activated at the same time in order to accomplish refresh operation.

SEMICONDUCTOR MEMORY HAVING IMPROVED SENSE AMPLIFIERS

BACKGROUND OF THE INVENTION

1. Field of the Invention

The present invention relates to a semiconductor memory, and more particularly to a semiconductor memory formed on a semiconductor chip and having a plurality of sense amplifiers, such as a bit-line sense amplifier, which are connected to the reference potential terminal of the semiconductor chip by means of a common line.

2. Description of the Related Art

FIG. 3 is a circuit diagram showing a part of the conventional DRAM (Dynamic Random Access Memory). As is shown in this figure, the DRAM has bit-line sense amplifiers SAa SAb, ..., each connected to a different pair of bit lines, (BLa, $\overline{BLa}$), (BLb, $\overline{BLb}$), or the like. These bit-line sense amplifiers are connected to the reference potential (Vss) terminal (i.e., the Vss potential pad) by means of a common source line 31 and a MOS transistor 32. (The MOS transistor 32 is used to activate the sense amplifiers SAa, SAb, .... Each sense amplifier comprises two N-type MOS transistors, whose drains and gates are cross-coupled, and whose sources are connected to each other and also to the common source line 31.

The current flowing in that MOS transistor of each sense amplifier, which is used to reduce the potential of the bit lines to a low level, is supplied through the source line 31 and discharged at the Vss terminal. Various parasitic resistances exist between the sense amplifiers and the Vss terminal, such as the resistance of the source line 31, the resistance of the MOS transistor 32, and the resistance of the Vss power-supply line. The greater the storage capacity of the DRAM, and hence, the larger the chip of the DRAM, the higher these parasitic resistances. Further, the greater the storage capacity of the DRAM, the greater the number of the bit-line sense amplifiers, which are simultaneously activated. More specifically, when the storage capacity increases four times, twice as many bit-line sense amplifiers are activated at the same time in order to accomplish refresh operation.

Consequently, the CR time constant of the sense amplifiers increases in proportion to the storage capacity of the DRAM. This is because the CR time constant is the product of capacitance C and resistance R, where C in turn is the product of the capacitance of one bit line and the number of the sense amplifiers, and R is the sum of the parasitic resistances existing between each sense amplifier and the Vss terminal.

No data can be read from a bit line to an I/0 bus until the sense amplifiers amplify the potentials of the bit lines to a sufficient degree. (Were the data be read out before the sense amplifiers sufficiently amplify the potentials of the bit lines, it would be destroyed) An increase of the CR time constant of the sense amplifiers directly results in an increase of the access time of the DRAM. In other words, the source potential of each sense amplifier cannot go fast to the Vss potential despite the amplification of the bit-line potential, and the bit lines cannot be latched quickly.

Two methods of decreasing the CR time constant have been proposed. The first method is to reduce the capacitance of each bit line. To this end, the memory cells are divided into more blocks, so that less memory cells are connected to one bit line. When the memory cells are divided into many blocks, however, the DRAM needs to have more decoders and more sense amplifiers, which occupy a greater area on the semiconductor chip. The second method is to use a source line comprising two aluminum layers, thereby reducing the parasitic resistance existing between each sense amplifier and the Vss terminal. This method is a forced, fast driving of the large capacitance of the source line, and results in capacitive coupling. This capacitive coupling is likely to greatly change the substrate capacitance, and to influence the other circuits which are used in combination within the DRAM adversely.

SUMMARY OF THE INVENTION

The present invention has been made to solve the problem inherent in the conventional DRAM, i.e., the long access time due to the greater CR time constant of the sense amplifiers incorporated in the DRAM, which cannot amplify the bit-line potential at sufficiently high speed. The object of the present invention is to provide a semiconductor memory having sense amplifiers whose CR time constant can be reduced, when necessary, and which can, therefore, amplify the bit-line potential so that data can be read from the memory to an I/0 bus at high speed.

According to the present invention, there is provided a semiconductor memory formed on a semiconductor chip comprising memory cells arranged in rows and columns, a plurality of sense amplifiers (SAa, SAb, ...) provided for the columns of memory cells, respectively, and a course line (1) connecting the sense amplifiers (SAa, SAb, ...) to the reference potential terminal (Vss) of the semiconductor chip. The semiconductor memory further comprises a plurality of switching elements (Sa, Sb, ...) and a control circuit (61). The switching elements are connected at one end to the sense amplifiers, respectively, and at the other end to the reference potential terminal. The control circuit generates signals for controlling the switching elements (Sa, Sb, ...).

When the switching elements (Sa, Sb, ...) coupled to the sense amplifiers (SAa, SAb, ...) are turned on by column-selecting signals (CD1a, CD1b, ...) supplied from the control circuit (61), they connect the sense amplifiers (SAa, SAb, ...) with the reference potential terminal (Vss). Hence, it is only the capacitances of the selected bit lines that determine the CR time constant of the sense amplifiers (SAa, SAb, ...). As a result, the CR time constant for the reference potential terminal (Vss) is small. The sense amplifiers (SAa, SAb, ...) can, thus, sense and amplify the bit-line potentials at high speed, whereby data can be read from the bit line to an I/0 but at sufficiently high speed.

BRIEF DESCRIPTION OF THE DRAWINGS

FIG. 1 is a circuit diagram showing a part of a DRAM, which is an embodiment of the present invention;

FIG. 4 is a circuit diagram showing a DRAM according to the invention, wherein includes both N-channel sense amplifiers and P-channel sense amplifiers;

DETAILED DESCRIPTION OF THE PREFERRED EMBODIMENTS

An embodiment of the present invention will now be described with reference to the accompanying drawings.

FIG. 1 is a diagram showing a part of a DRAM, which is the embodiment of the invention. As is shown in FIG. 1, the DRAM has sense amplifiers SAa, SAb, ... connected to the bit-line pairs (BLa, $\overline{BLa}$), (BLb, $\overline{BLb}$), ), . . . , respectively. Each sense amplifier comprises two N-type MOS transistors whose drains and gates are cross-coupled, and whose sources are connected to, each other. The bit lines of this DRAM are pre-charged to a half Vcc power-supply potential, and two P-type MOS transistors (not shown) are connected to each sense amplifier in order to restore the potentials of the bit lines.

The connecting point 3 of the MOS transistors of the sense amplifier SAa, and the connecting point 4 of the MOS transistors of the sense amplifier SAb are connected to normally ON type MOS transistors Na and Nb, respectively. (These transistors Na and Nb are N-type MOS transistors whose gates are applied with the Vcc power-supply voltage.) The MOS transistors Na and Nb are connected to a common source line 1. The common source line 1 is connected to a MOS transistor 2 which is provided for activating the sense amplifiers SAa, SAb, .... The MOS transistor 2 is coupled to the reference potential terminal (i.e., the Vss-potential pad) of the memory chip. Thus, the connecting points 3 and 4 are connected to the reference potential terminal by means of the transistors Na and Nb, the common source line 1, and the MOS transistor 2. The MOS transistors Na and Nb can be replaced by resistors made of polycrystalline silicon.

Figure 2:
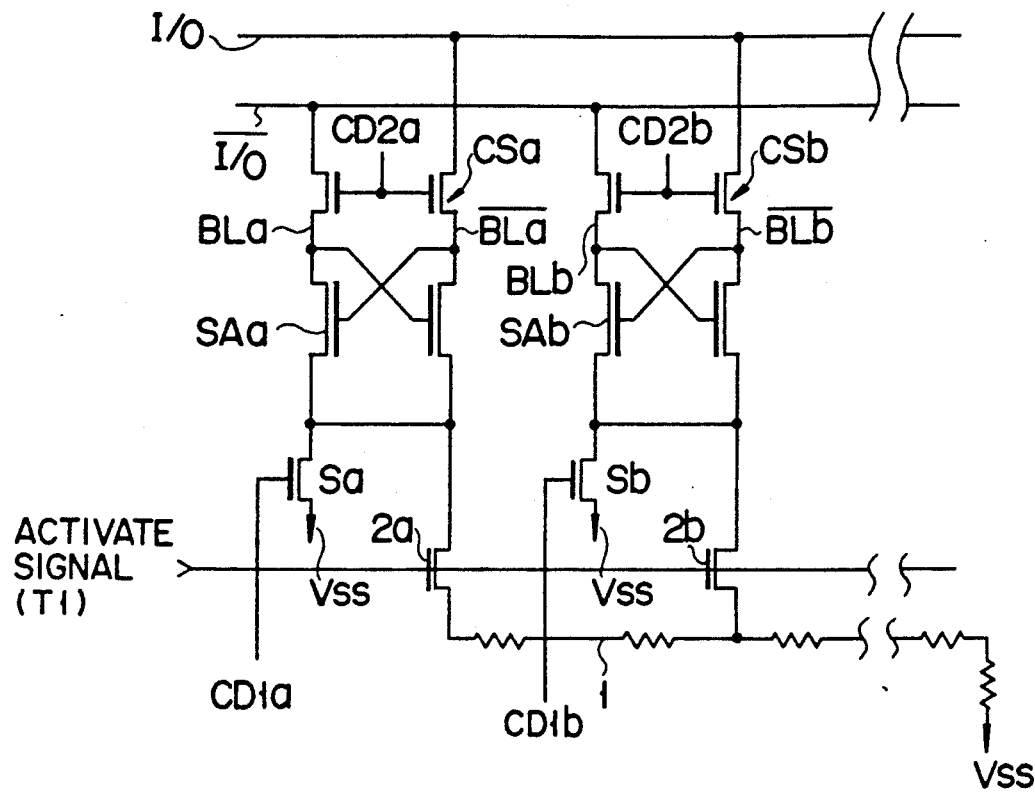
FIG. 2 is a circuit diagram showing a modification of the DRAM illustrated in FIG. 1.
Figure 3:
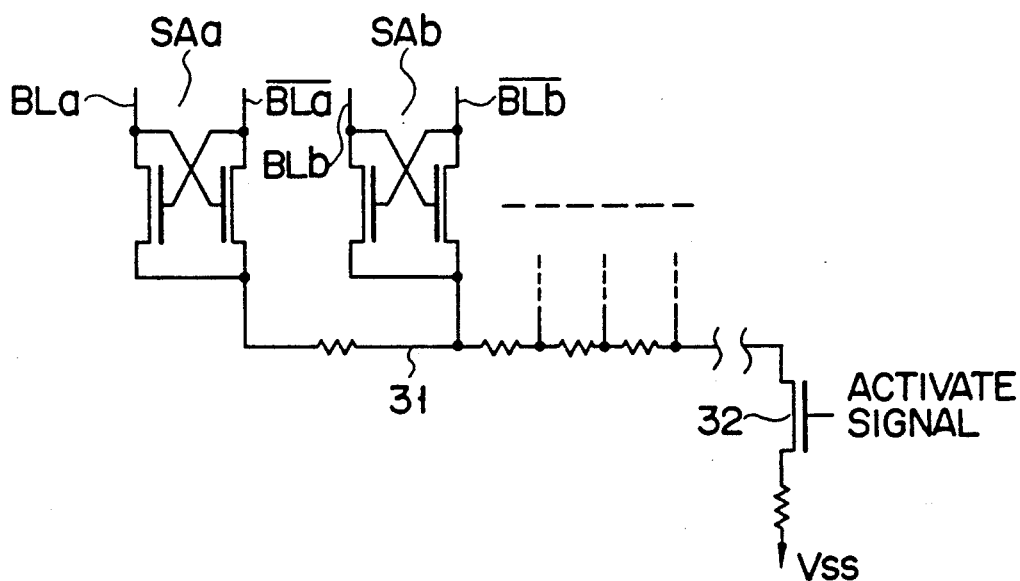
FIG. 3 is a circuit diagram representing a part of the conventional DRAW.

FIG. 2 is a circuit diagram showing a modification of the DRAM shown in FIG. 1. The modified DRAM is different from the DRAM shown in FIG. 1 in two respects. First, a timing signal T1 is supplied to the gates of the MOS transistors Na and Nb, so that they are turned on at the same time. Second, it comprises no element equivalent to the MOS transistor 2 used in the DRAM shown in FIG. 1, so that the DRAM can be made smaller.

The DRAM shown in FIG. 1 will be further described. The connecting points 3 and 4 of the sense amplifiers SAa, SAb, ... are connected to the Vss-potential pad by means of switching elements Sa, Sb, ..., respectively. These switching elements Sa, Sb, ... are selectively turned on under the control of a control circuit 61 shown in FIG. 5. They are, for example, N-type MOS transistors, whose gates are coupled to receive column-selecting signal CD1a, CD1b, ....

The DRAM further comprises column switches CSa, CSb, ..., and a pair of data lines I/0 and $\overline{I/0}$. The column switches CSa, CSb, ... connect the bit-line pairs (BLa, $\overline{BLa}$), (BLb, $\overline{BLb}$), ... with the data lines I/0 and $\overline{I/0}$. The column switches CSa, CSb, ... are, for example, N-type MOS transistors, whose gates are connected to receive column-selecting signals CD2a, CD2b, ... output by a column decoder (not shown).

Figure 6:
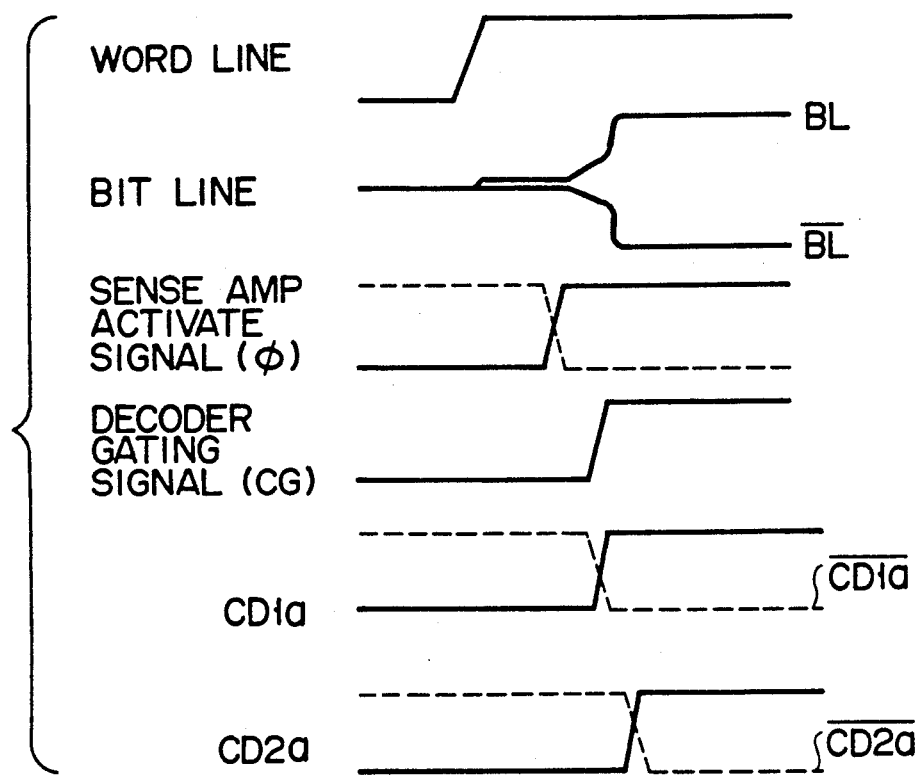
FIG. 6 is a timing chart illustrating the relationship between a column-selecting signal and other signals.
Figures 5, 7:
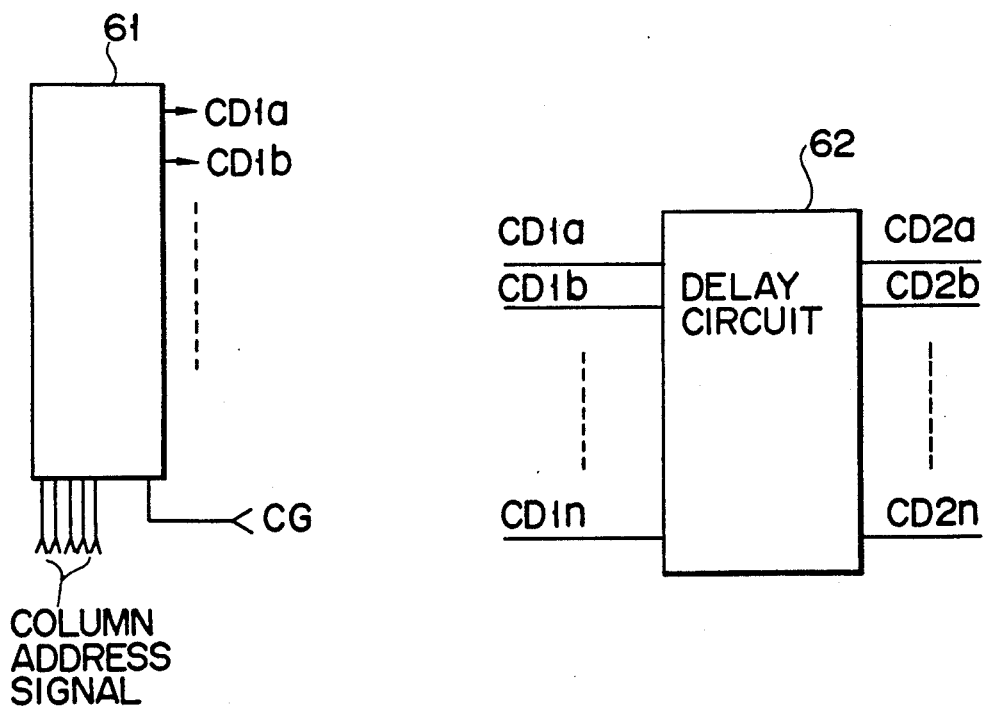
FIG. 5 is a diagram explaining the relationship between a column-selecting signal and a decoder-gating signal.
FIG. 7 a diagram showing a circuit for delaying the column-selecting signal which control a column switch.

The column-selecting signals CD1a, CD1b, ... are output of the control circuit 61. As shown in FIG. 5, the control circuit 61 receives the column address signals and a decoder-gating signal CG. As has been described, the signals CD1a, CD1b, ... control the switching elements Sa, Sb, ... (FIG. 1). The control circuit 61 outputs any column-selecting signal designated by the column address signals Y supplied to the circuit 61, upon receipt of the decoder-gating signal CG which is input to the circuit 61. The column-selecting signals CD2a, CD2b, ..., which control the column switches CSa, CSb, ..., are generated some time later than the column-selecting signals CD1a, CD1b, ..., as is evident from FIG. 6. As shown also in FIG. 6, the decoder-gating signal CG is generated a little later than a sense amplifier activate signal $\phi$. The column-selecting signals CD1a, CD1b, ... are generated, as has been pointed out, simultaneously with the decoder-gating signal CG. The column-selecting signals CD2a, CD2b, ... are produced by delaying the column-generating signals CD1a, CD1b, ... by means of the delay circuit illustrated in FIG. 7.

It will now be explained how the sense amplifiers of the DRAM detect the potentials of the bit lines and how they read data to the I/0 buses. When the MOS transistor 2 is turned on, the sense amplifiers SAa, SAb, ... start detecting the potentials of the bit lines. Simultaneously, the currents flowing in those MOS transistors of the sense amplifiers SAa, SAb, ..., which are used to reduce the potential of the bit lines to a low level, are supplied via the normally ON type MOS transistors Na and Nb and discharged at the Vss terminal.

Various parasitic resistances exist between each sense amplifier and the Vss terminal, such as the resistance of the source line 1, the resistance of the MOS transistor 2, and the resistance of the Vss powersupply line. However, each sense amplifier is by-passed to the Vss terminals by the switching elements Sa, Sb, .... This is because the switching elements Sa, Sb, ..., which are connected to the sense amplifiers of any selected column, have been selected and turned on in accordance with the column-selecting signals CD1a, CD1b, ....

That is, when the column-selecting signals CD1a, CD1b, ... become active, some of the columns of sense amplifiers, only a few, in most cases, are selected. Inevitably, parasitic resistances comes into being between the sense amplifiers of the selected columns, on the one hand and the Vss terminal, on the other. Nonetheless, the total capacitance of the few bit lines coupled to these sense amplifiers is very small. Therefore, the CR time constant of the sense amplifier is extremely small, however thin the line connecting each sense amplifier and the Vss terminals is. The source potential of the sense amplifier thus falls quickly to the Vss potential. The pairs of bit lines, which are connected to the sense amplifiers, are quickly latched. In other words, a specific potential difference is quickly set between these bit lines. That is, the sense amplifiers can quickly detect the potentials of the bit lines. Moreover, the potential difference between the bit lines of each pair is read to the corresponding I/0 bus through the switching element which has been turned on when the column-selecting signal becomes active. Nevertheless, since a specific potential difference is, quickly set between these bit lines, the data stored in any memory cell coupled to the bit lines is not destroyed, and can be readily read out to the I/0 bus at high speed.

As has been noted, FIG. 2 is a diagram illustrating a modification of the DRAM shown in FIG. 1. This modification is different form the DRAM shown in FIG. 1, in two respects. First, it has no element equivalent to the MOS transistor 2. Secondly, sense amplifiers SAa, SAb, ... are connected to a common source line 1 by MOS transistors 2a, 2b, ... which are provided for activating the sense amplifiers SAa, SAb, .... The modification accomplishes the same advantages as the DRAM shown in FIG. 1.

FIG. 4 is a circuit diagram representing a DRAM according to this invention. This DRAM is of CMOS structure. In other words, switching elements are provided not only for a sense amplifier comprising N-type transistors 43 and 44, but also for a sense amplifier comprising P-type transistors 41 and 42. More precisely, a switching element 47 is connected to the sense amplifier comprising N-type transistors 43 and 44. A column-selecting switch CSa is connected between I/0 lines. The connecting point of the sources of the transistors 43 and 44 is connected to the reference potential terminal (i.e. a Vss potential pad) by a resistance component 48, a MOS transistor 50 for activating the sense amplifier, and a common source line 51. Similarly, a switching element 45 is connected to the sense amplifier comprising P-type transistors 41 and 42. The connecting point of the sources of the transistors 41 and 42 is connected to a power-supply terminal (Vcc) by a resistance component 46, a MOS transistor 49 for activating the sense amplifier, and a common source line 52. The unit comprising the elements 41, 42, 45, 46, 49, and 52, which is connected to the Vcc terminal, is symmetrical in structure to the unit comprising the elements 43, 44, 47, 48, 50, and 51, which is connected to the Vss terminal.

Obviously, since only two switching elements, i.e., the elements 45 and 47, suffice to detect the potential difference between the bit lines, it is possible to detect the potential difference at high speed. It should be noted that the resistance component 46 is a normally ON type MOS transistor, and is connected in the common source line 52.

As has been described above, the present invention provides a semiconductor memory having sense amplifiers whose CR time constant can be reduced, when necessary, and which can, therefore, amplify the bit-line potential so that data can be read from the memory to an I/0 bus at high speed.

What is claimed is:

1. A semiconductor memory device comprising:
    a first sense amplifier;
    a reference potential terminal;
    a first switching element connected between said first sense amplifier and said reference potential terminal;
    a second sense amplifier connected to said first sense amplifier via an I/O line;
    a second switching element connected between said second sense amplifier and said reference potential terminal; and
    control means for generating and supplying a first column-selecting signal to said first switching element, to turn said first switching element on and off, and for generating and supplying a second column-selecting signal to said second switching element to turn said second switching element on and off.

2. The semiconductor device according to claim 1, further comprising:
    a column switch element connected to said first sense amplifier wherein said control means generates and supplies a third column-selecting signal to said column switch element, said third column-selecting signal being activated after said first and second column-selecting signals.

3. The semiconductor memory device according to claim 1, further comprising:
    resistor means for providing a resistance between said first sense first amplifier and said reference potential terminal.

4. The semiconductor memory device according to claim 3, wherein said resistor means includes a normally ON type MOS transistor.

5. The semiconductor memory device according to claim 3, wherein said resistor means includes a transistor whose gate is connected to receive a timing signal.

6. The semiconductor memory device according to claim 3, wherein said resistor means includes a resistor.

7. A semiconductor memory device comprising:
    a first sense amplifier;
    a reference potential terminal;
    a first switching element connected between said first sense amplifier and said reference potential terminal;
    a second sense amplifier connected to said first sense amplifier via an I/O line;
    a second switching element connected between said second sense amplifier and said reference potential terminal;
    control means for generating and supplying a first column-selecting signal to said first switching element, to turn said first switching element on and off, and for generating and supplying a second column-selecting signal to said second switching element, to turn said second switching element on and off; and
    resistor means for providing a resistance between said first sense amplifier and said reference potential terminal.

8. The semiconductor device according to claim 7, further comprising:
    a transistor connected to said first sense amplifier wherein said control means generates and supplies a third column-selecting signal to the gate of said transistor, said third column-selecting signal being activated after said first and second column-selecting signals.

9. The semiconductor memory device according to claim 7, wherein said resistor means includes a normally ON type MOS transistor.

10. The semiconductor memory device according to claim 7, wherein said resistor means includes a second transistor whose gate is connected to receive a timing signal.

11. The semiconductor memory device according to claim 7, wherein said resistor means is a resistor made of polysilicon.

12. A semiconductor memory device comprising:
    an I/O line;
    a first sense amplifier, connected to said I/O line, and comprising a transistor of a first conductivity type;
    a first switching element comprising a transistor of the first conductivity type and connected between said first sense amplifier and a reference potential terminal;

a second sense amplifier connected to said first sense amplifier via said I/O line and comprising a transistor of a second conductivity type;

a second switching element comprising a transistor of the second conductivity type and connected between said second sense amplifier and a power supply terminal;

control means for generating and supplying a first column-selecting signal to a gate of said first switching element, to turn said first switching element on and off, and for generating and supplying a second column-selecting signal to a gate of said second switching element, to turn said second switching element on and off.

13. The semiconductor memory device according to claim 12, further comprising:

resistor means for providing a resistance between said first sense amplifier and said reference potential terminal.

14. The semiconductor memory device according to claim 13, wherein said transistors of the first conductivity type are N-type, and said transistors of the second conductivity type are P-type.

15. The semiconductor memory device according to claim 13, wherein said resistor means includes a normally ON type MOS transistor.

16. The semiconductor memory device according to claim 13, wherein said resistor means includes a transistor whose gate is connect to receive a timing signal.

17. The semiconductor memory device according to claim 13, wherein said resistor means includes a resistor.

18. The semiconductor device according to claim 12, further comprising:

a column switch element connected to at least one of said first and second sense amplifiers wherein said control means generates and supplies a third column-selecting signal to said column switch element, said third column-selecting signal being activated after said first and second column-selecting signals.

19. A semiconductor memory device comprising:

a reference potential terminal;

a power supply terminal;

a first sense amplifier comprising transistors of a first conductivity type;

a first switching element comprising a transistor of the first conductivity type and connected between said first sense amplifier and said reference potential terminal;

a second sense amplifier connected to said first sense amplifier and comprising transistors of a second conductivity type;

a second switching element comprising a transistor of the second conductivity type and connected between said second sense amplifier and said power supply terminal;

control means for generating and supplying a first column-selecting signal to said first switching element, to turn said first switching element on and off, and for generating and supplying a second column-selecting signal to said second switching element, to turn said second switching element on and off, said second column selecting signal being activated after said first column selecting signal;

a first normally ON type MOS transistor connected between said first sense amplifier and said reference potential terminal; and a second normally On type MOS transistor connected between said second sense amplifier and said power supply terminal.

20. A semiconductor memory device according to claim 1, further comprising:

a column switch element, connected to one end of said first sense amplifier, having a gate which receives said first column-selecting signal.

* * * * *